United States Patent [19]

Kurisu

[11] Patent Number: 5,321,321
[45] Date of Patent: Jun. 14, 1994

[54] EMITTER-COUPLED LOGIC (ECL) CIRCUIT WITH AN INDUCTIVELY COUPLED OUTPUT STAGE FOR ENHANCED OPERATING SPEED

[75] Inventor: Masakazu Kurisu, Tokyo, Japan
[73] Assignee: NEC Corporation, Tokyo, Japan
[21] Appl. No.: 937,388
[22] Filed: Aug. 31, 1992

[30] Foreign Application Priority Data

Aug. 30, 1991 [JP]  Japan ................................. 3-220410

[51] Int. Cl.$^5$ ................... H03K 19/086; H03K 19/013
[52] U.S. Cl. ................... 307/455; 307/443; 307/446; 257/531
[58] Field of Search ............... 307/455, 246, 446, 443; 257/277, 531

[56] References Cited

U.S. PATENT DOCUMENTS

| | | | |
|---|---|---|---|
| 3,728,559 | 4/1973 | Spann et al. .................... | 307/264 |
| 4,005,317 | 1/1977 | Hinrichs ........................... | 307/246 |
| 4,144,591 | 3/1979 | Brady ................................ | 257/277 |
| 4,687,953 | 8/1987 | Varadarajan .................... | 307/443 |
| 4,785,345 | 11/1988 | Rawls et al. ..................... | 257/531 |
| 4,906,869 | 3/1990 | Masuoka ........................... | 307/455 |
| 5,027,013 | 6/1991 | Coy et al. ......................... | 307/455 |

FOREIGN PATENT DOCUMENTS 0297623  4/1989  European Pat. Off. .

*Primary Examiner*—Edward P. Westin
*Assistant Examiner*—Benjamin D. Driscoll
*Attorney, Agent, or Firm*—Sughrue, Mion, Zinn, Macpeak & Seas

[57]  ABSTRACT

An emitter-coupled logic circuit includes a differential pair of transistors and an emitter follower output stage. A load inductor is connected to one of the differential transistors and a load resistor is connected to the other one of the differential transistors. The emitter follower output stage having an input node connected to the load resistor and an output node is connected to a constant current source formed by a current source transistor and an inductor which is AC-coupled to the load inductor by a mutual induction effect. The pull-up and pull-down delay times of the emitter coupled logic circuit can be reduced in a wide range from a light load to a heavy load.

7 Claims, 17 Drawing Sheets

EMITTER-COUPLED LOGIC (ECL) CIRCUIT WITH AN INDUCTIVELY COUPLED OUTPUT STAGE FOR ENHANCED OPERATING SPEED

BACKGROUND OF THE INVENTION

1. Field of the Invention

The present invention relates to a semiconductor integrated circuit device in which an electronic circuit is formed on a semiconductor substrate or semi-insulated substrate and, more particularly, to an emitter-coupled logic (hereinafter referred to as "ECL") circuit operable at a high processing speed.

2. Description of the Prior Art

FIG. 1 shows a typical example of a conventional ECL circuit used as an inverter, to which the present invention relates. In FIG. 1, the ECL circuit comprises a differential pair of transistors Q1 and Q2 whose emitters are connected together; load resistors $R_L$ connected to the collectors of the transistors Q1, Q2, respectively; a constant current source formed by a transistor Q3, a resistor $R_E$ and a first constant voltage source $V_{CS1}$; a reference constant voltage source $V_{REF}$; and an emitter follower formed by transistors Q4, Q5 and a second constant voltage source $V_{CS2}$. In addition, the transistor Q5 and the constant voltage source $V_{CS2}$ may be replaced by a resistor.

With such a conventional ECL circuit (an inverter) as illustrated and described above, when the level of an input signal changes from high to low, the output transistor Q4 turns ON so that a load capacitance $C_L$ is charged, whereby the level of an output changes from a low to a high level (pull-up). On the other hand, when the input level changes from low to high, the transistor Q4 turns OFF while discharging electric charges accumulated in the load capacitance $C_L$ through an output resistance of the transistor Q5, thus the output level changes from a high to a low level (pull-down). Time required for the pulling-down is determined according to a time constant decided by a load capacitance and an output resistance. Therefore, the time period required for the pulling-down is longer than that required for the pulling-up, which is a disadvantage in this example of the conventional circuit. The larger the load capacitance, the more significant disadvantage occurs. FIG. 2 depicts a SPICE simulation result for an input/output voltage waveform where a bias current of the paired differential transistors Q1, Q2 is 3 mA, a load resistance is 160 Ω (hence a logical amplitude is 480 mV), a bias current of the emitter follower is 3 mA, a fan-in is 1, a fan-out is 1, and a load capacitance is 0.4 pF. As shown in FIG. 2., by using device parameters corresponding to those of the latest silicon bipolar transistors, there is obtained a simulation result including a pull-up delay time of 40 picoseconds (psec) and a pull-down delay time of 50 psec.

In the conventional ECL circuits, a pull-down delay time is restricted by the time constant determined by a load capacitance $C_L$ and an output resistance of the transistor Q5, so that it is disadvantageously longer than a pull-up delay time. The disadvantage is particularly significant in the case where the load capacitance is large. This is one of problems to be solved by the invention, in the conventional ECL circuits.

SUMMARY OF THE INVENTION

It is, therefore, a primary object of the invention to overcome the problems existing in the conventional ECL circuit and to provide an improved ECL circuit in which a pull-down delay time is effectively reduced.

According to the present invention, there is provided an emitter-coupled logic circuit comprising:

a pair of differential transistors whose emitters are connected with each other;

a load resistor connected between a first power supply terminal and a collector of one of the differential transistors;

a load inductor connected between the first power supply terminal and a collector of the other one of the differential transistors;

a first constant current source connected between a second power supply terminal and the common emitters of the differential transistors, for supplying a constant current to the differential transistors; and an emitter follower output stage whose input node is connected to the load resistor and whose output node is coupled to the second power supply terminal through a second constant current source including an inductor which is AC-coupled with the load inductor by a mutual induction effect.

BRIEF DESCRIPTION OF THE DRAWINGS

The above and other objects, features and advantages of the present invention will be apparent from the following description of some preferred embodiments of the invention explained with reference to the accompanying drawings, in which.

PREFERRED EMBODIMENTS OF THE INVENTION

Figure 1:
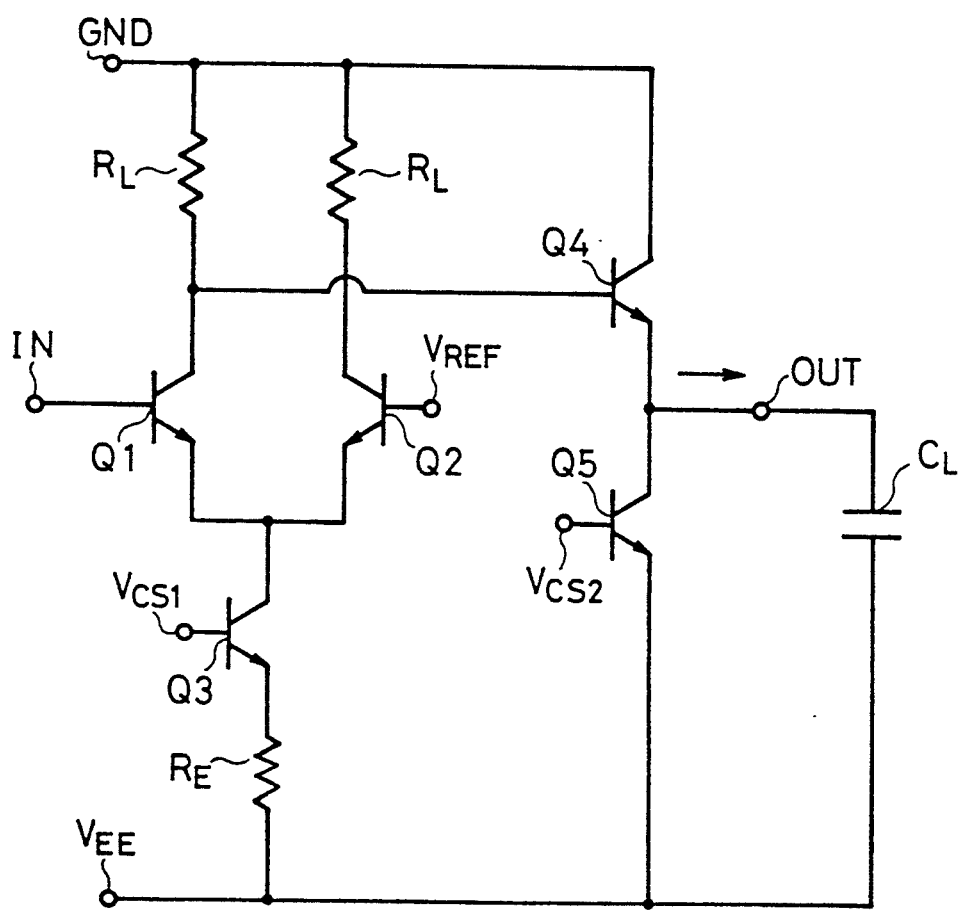
FIG. 1 is a circuit diagram of a conventional ECL inverter circuit.

Now, some preferred embodiments of the invention will be explained with reference to the accompanying drawings. It is to be noted that, throughout the following explanation, the same or like reference numerals refer to the same or like elements in all the figures of the drawings.

First Embodiment

Figure 3:
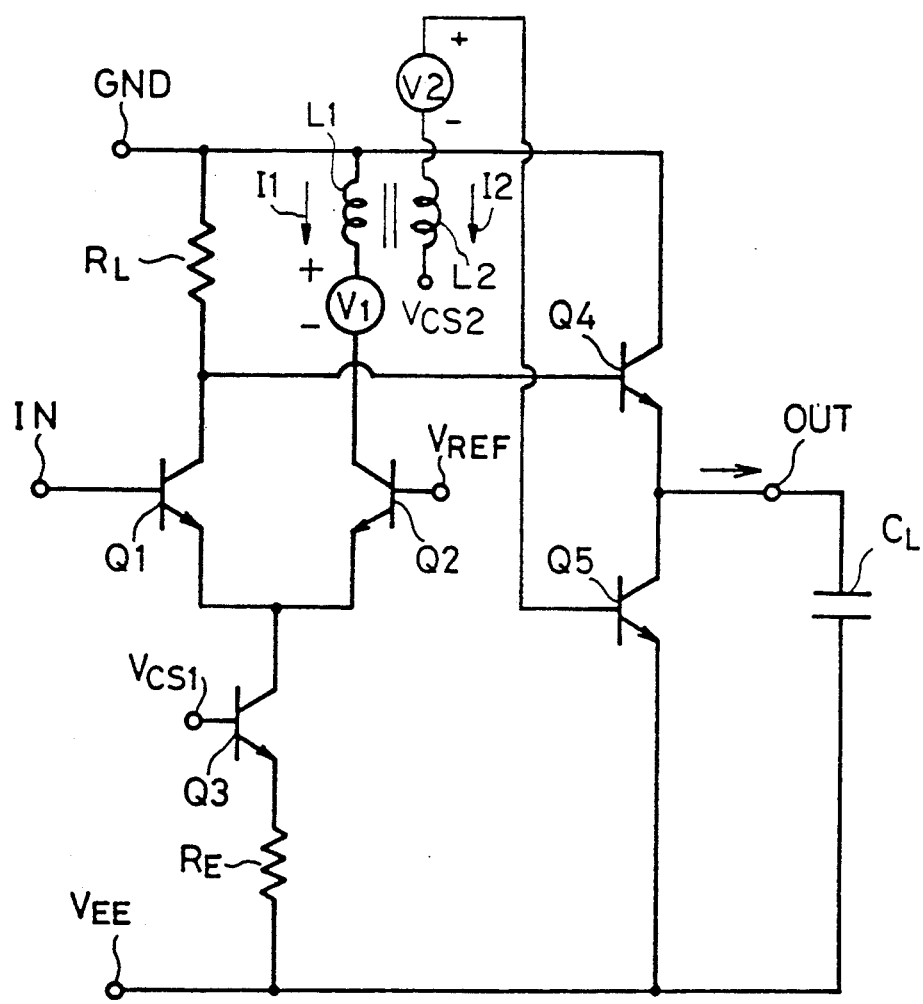
FIG. 3 is a circuit diagram of an ECL inverter circuit according to a first embodiment of the invention.

FIG. 3 is an ECL inverter circuit of a first embodiment according to the present invention. In FIG. 3, the symbol "L1" represents a load inductor which is in place of one of the load resistors $R_L$ used in the conventional ECL circuit shown in FIG. 1; the symbol "I1" represents a current which flows in the load inductor L1; the symbol "L2" represents an inductor inserted between the base of the load transistor Q5 of the constant current source for the emitter follower and the constant voltage source $V_{CS2}$; the symbol "I2" represents a current which flows in the inductor L2; the symbol "V1" represents an electromotive force mutually induced in proportion to a time-differential of the current I2 flowing in the inductor L2; and the symbol "V2" represents an electromotive force mutually induced in proportion to a time-differential of a current I1 flowing in the load inductor L1. Assuming that the mutual inductance between the inductors L1 and L2 is M, the electromotive forces V1 and V2 can be expressed as the following Equations (1) and (2), respectively:

$$V1 = M \cdot dI2/dt \quad (1)$$

$$V2 = M \cdot dI1/dt \quad (2)$$

Where the polarities of V1, V2 and the directions of I1, I2 are respectively defined as shown in FIG. 3, the mutual inductance M satisfies the following relation (3):

$$M < 0 \quad (3)$$

Next, the operation principle of the this first embodiment is described hereunder.

First, when the level of the input signal applied to an input terminal IN changes from high to low, the time-differential on the current I1 satisfies the relation as follows:

$$dI1/dt > 0$$

Therefore, the electromotive force V2 which satisfies the relation V2<0 is generated in the inductor L2 according to the above Equations (2) and (3). Accordingly, the transistor Q5 turns OFF, and the transistor Q4 charges the load capacitance $C_L$ with the emitter current from the transistor Q4 becoming fully an output current of the ECL circuit. As a result, the time period required for changing the output level from a low value to a high value (pull-up delay time) is reduced.

Contrary to the above, when the input level changes from low to high, the time-differential on the current I1 satisfies the relation as follows:

$$dI1/dt < 0$$

Therefore, the electromotive force V2 which satisfies the relation V2>0 is generated in the inductor L2 according to the above Equations (2) and (3). Accordingly, the transistor Q5 turns ON, thereby discharging the electric charges accumulated in the load capacitance $C_L$ connected to the output terminal OUT. As a result, the time period required for changing the output level from a high value to a low value (pull-down delay time) is effectively reduced.

Here, simulation results obtained by the present embodiment is described with reference to FIGS. 4A and FIG. 4B. It is assumed that conditions or parameters used for the simulation are identical to those of the conventional ECL circuit shown in FIG. 1. Specifically, the conditions include a bias current of 3 mA for the paired differential transistors Q1 and Q2, a load resistance of 160Ω (hence a logical amplitude of 480 mV), a bias current of 3 mA for the emitter follower, a fan-in of 1, a fan-out of 1, and a load capacitance of 0.4 pF.

Figure 4A:
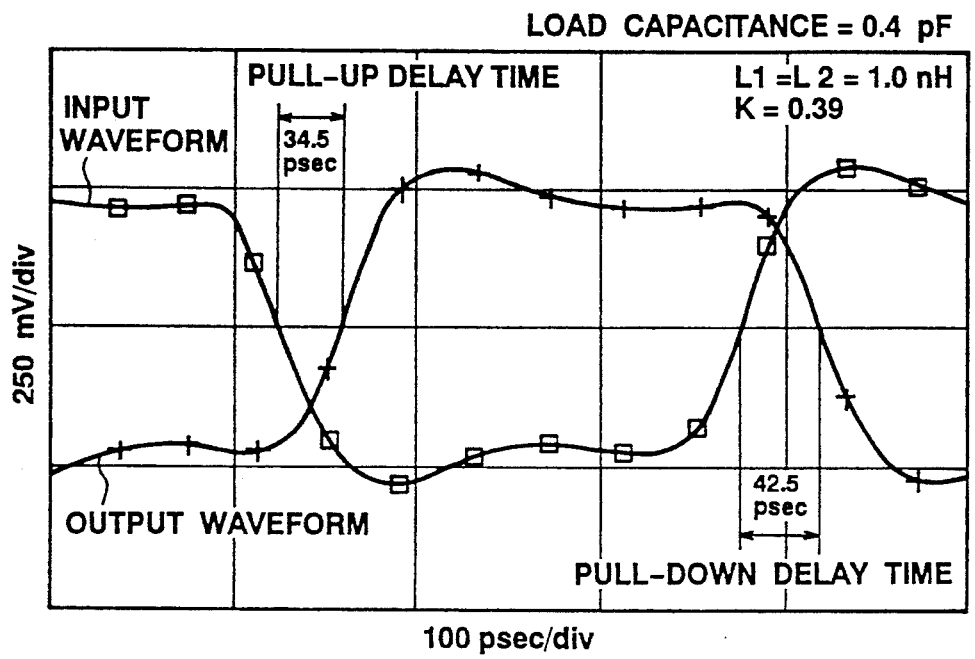
FIGS. 4A and 4B are an input/output voltage waveform and an output current waveform, respectively, of the first embodiment of the invention shown in FIG. 3.
Figure 4B:
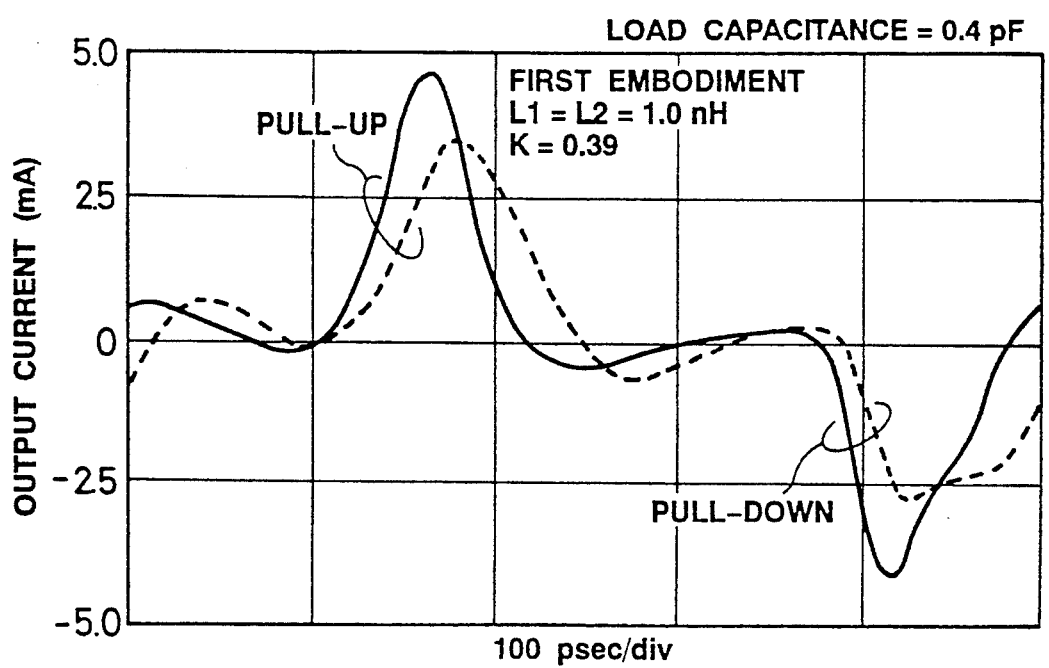

FIG. 4A shows input/output voltage waveforms, and FIG. 4B shows the corresponding output current waveforms, respectively, in the case where the following values are assumed to be satisfied:

$$L1 = L2 = 1.0 nH \quad (4)$$

$$K = 0.39 \quad (5)$$

where K is a coupling coefficient which is defined as follows:

$$K = |M| \frac{1}{\sqrt{L1 \cdot L2}} \quad (6)$$

Figure 2:
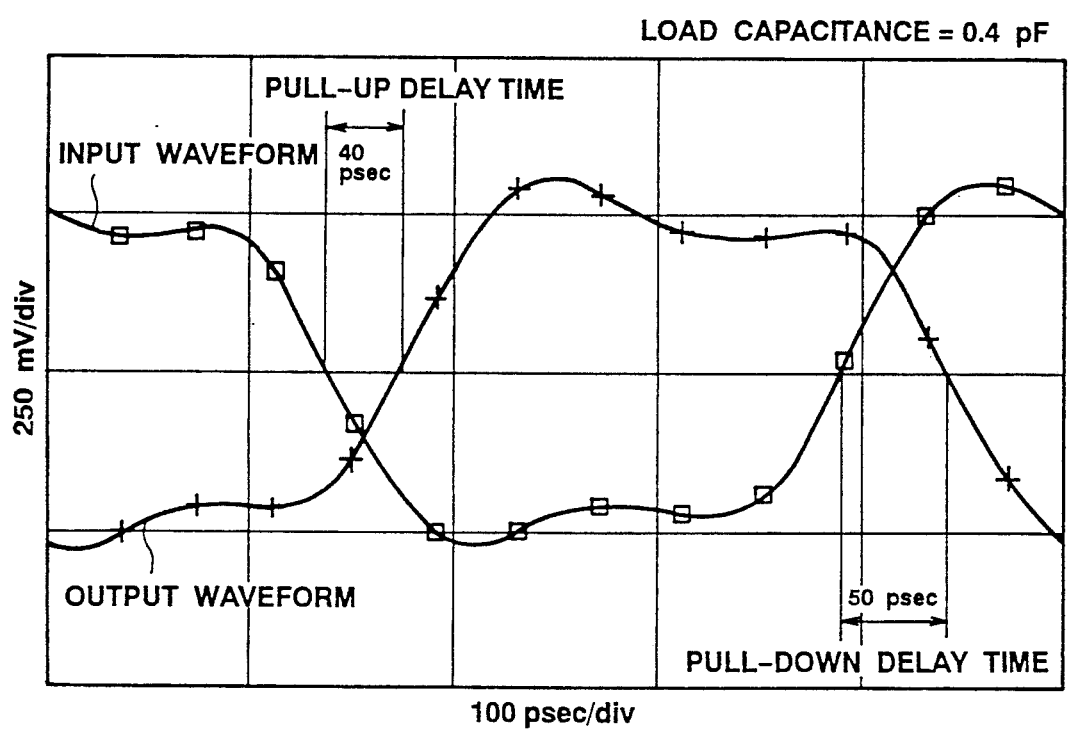
FIG. 2 is an input/output voltage waveform of the conventional ECL inverter circuit shown in FIG. 1.
Figure 5:
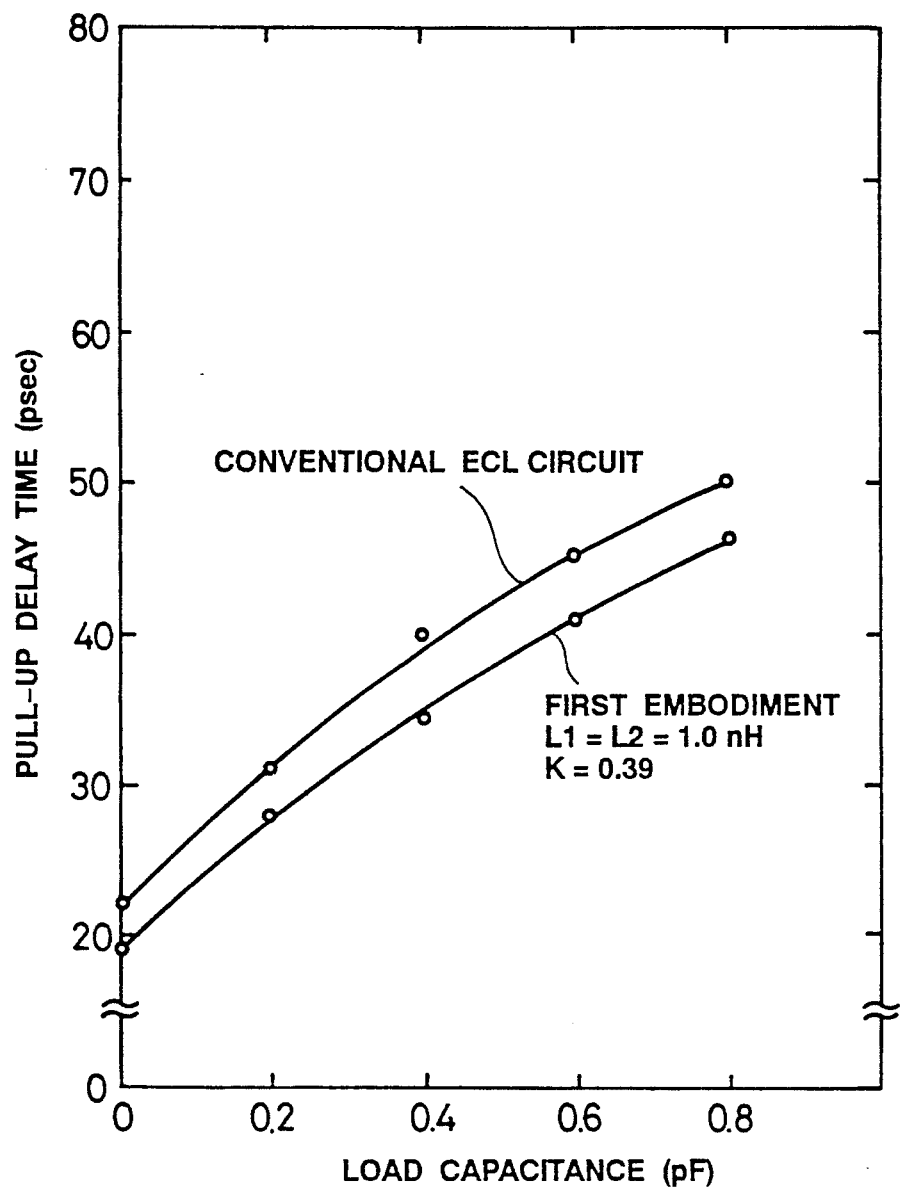
FIG. 5 is a graph illustrating the dependency of the pull-up delay time on the load capacitance of the first embodiment according to the invention.
Figure 6:
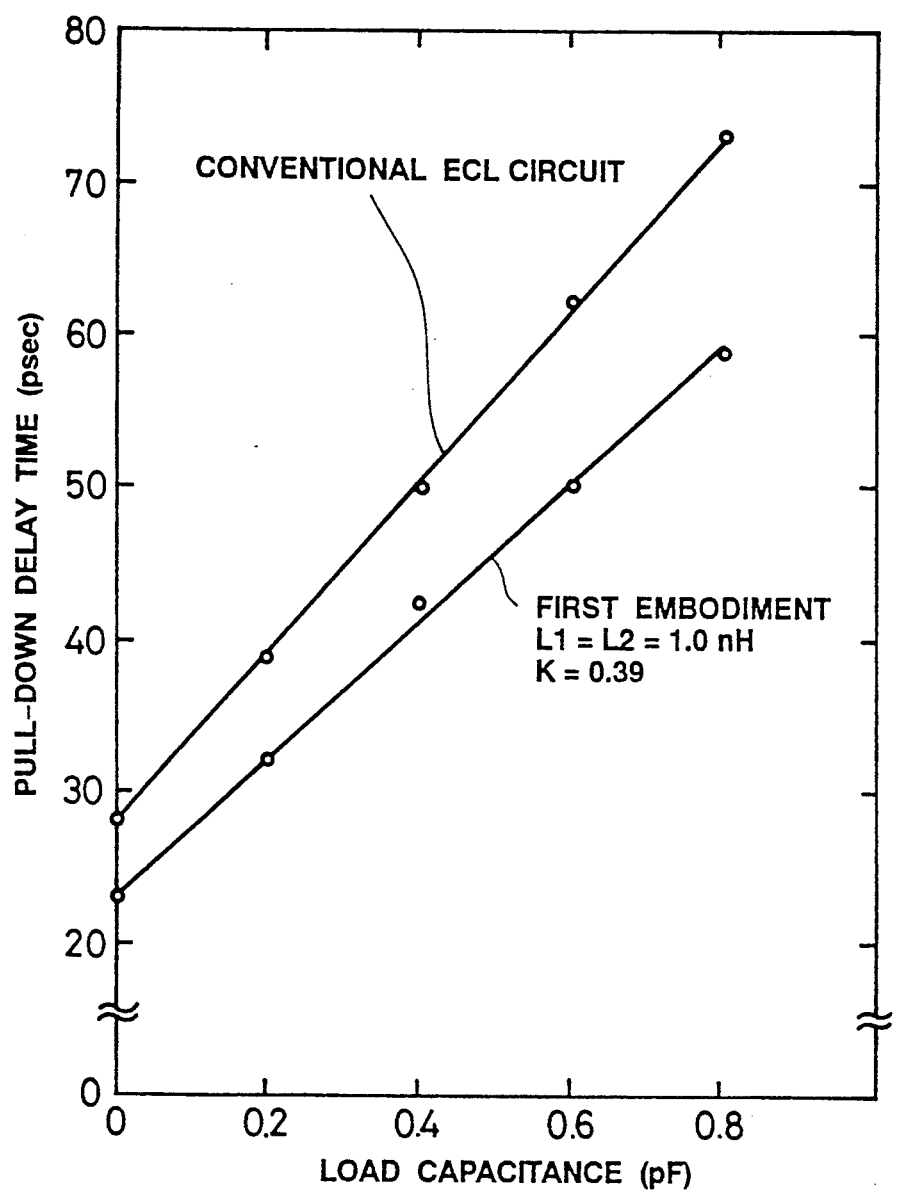
FIG. 6 is a graph illustrating the dependency of the pull-down delay time on the load capacitance of the first embodiment according to the invention.
Figure 7:
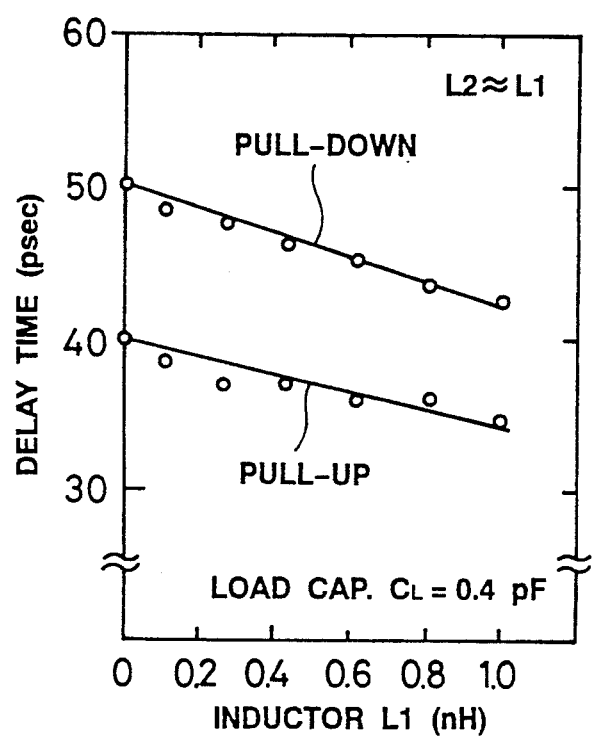
FIG. 7 is a graph showing a relationship between a load inductor L1 and a delay time of the first embodiment according to the invention.

As readily appreciated from the FIG. 4A graph, the pull-up delay time is 34.5 psec and the pull-down delay time is 42.5 psec, which indicates improvements of 5.5 psec (14%) and 7.5 psec (15%), respectively, from the conventional ECL circuit shown in FIG. 2 graph. Referring to FIG. 4B, it is also understood that an output current flows more transiently and quickly than the conventional ECL circuit in both the periods of the pull-up and pull-down operations, whereby the load capacitance is charged and discharged more quickly. FIGS. 5 and 6 show the dependencies of pull-up and pull-down delay time on the load capacitance. It is further understood that the delay time periods are improved from those of the conventional ECL circuit in a wide range from a light load to a heavy load. FIG. 7 shows a relationship between the inductance of the load inductor L1 and the delay time. For this simulation, it is assumed that the load capacitance $C_L$ is 0.4 pF and $$L2 \approx L1.$$

In accordance with the increase of the inductance of the load inductor L1, the delay time period is reduced. However, if the inductance of the load inductor L1 is large in excess, there occurs overshooting or undershooting in the output waveform with a light load. Therefore, the most suitable inductance of the inductor is $$L1 \approx 1.0 nH.$$

Figure 8:
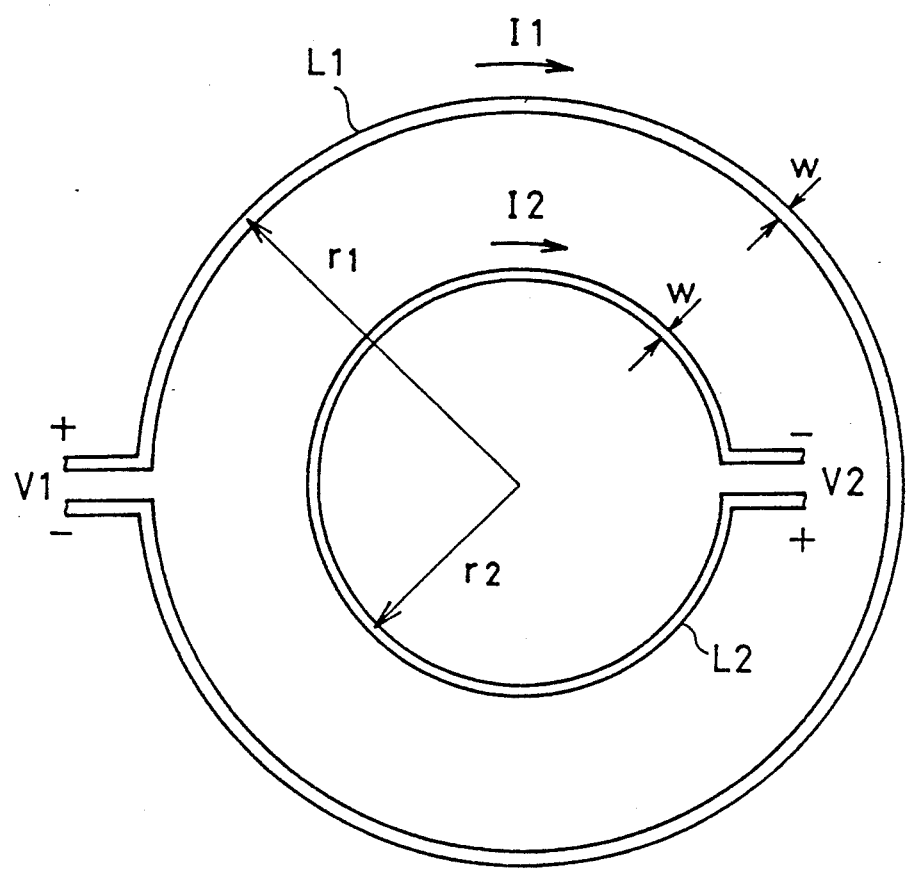
FIG. 8 is a schematic view typically showing a relationship between the load inductor L1 and the inductor L2 of the first embodiment according to the invention.

Hereunder, practical design methods for realizing the self-inductance having a value shown by the Equation (4) and the coupling coefficient shown by the Equation (5) on a semiconductor substrate or a semi-insulated substrate are explained. FIG. 8 shows concentric circular loops of radii r1 and r2 formed with aluminum or gold wirings. If it is assumed that the polarities of V1, V2 and the current directions of I1 and I2 are as shown in FIG. 8, the following relations are satisfied.

$$V1 = -L1 \cdot dI1/dt + M \cdot dI2/dt$$

$$V2 = -L2 \cdot dI2/dt + M \cdot dI1/dt.$$

$$L1 > 0$$
$$L2 > 0$$
$$M < 0$$

are also satisfied. Here, it is assumed that the symbols w and t represent the width and thickness of the wirings, respectively. However, the resistance of the wirings is ignored. By approximating the section of the wiring by a circle while defining an effective radius thereof by $$reff = \sqrt{\frac{w \cdot t}{\pi}} \quad (7)$$

Figure 9:
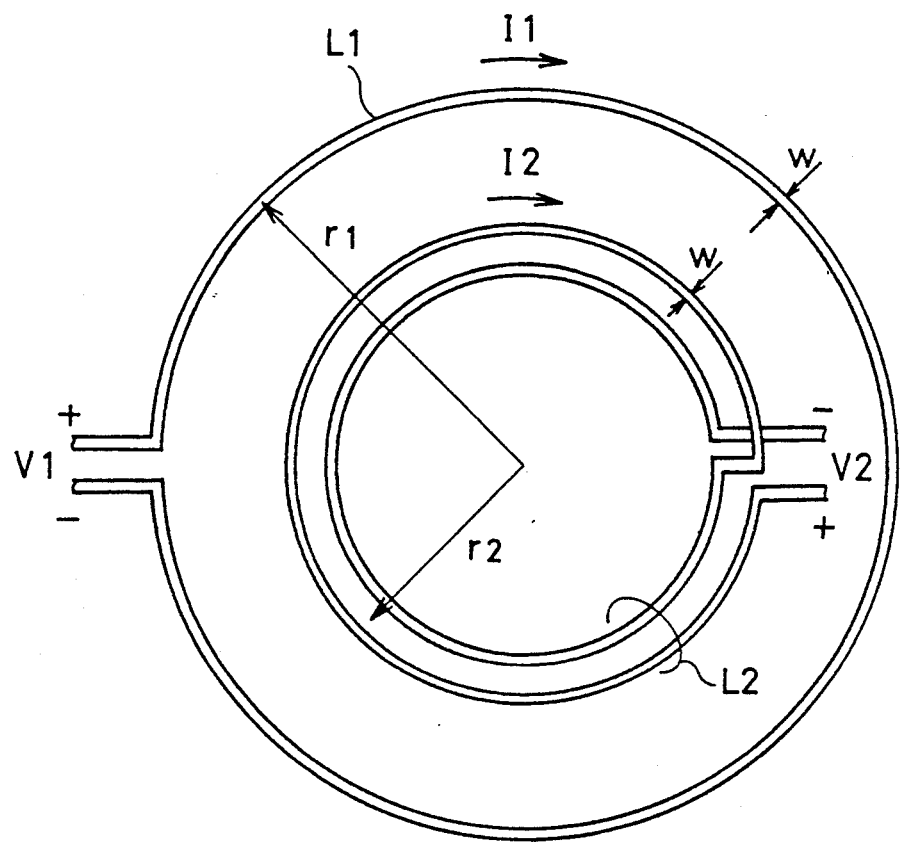
FIG. 9 is a schematic view showing an example of the load inductor L1 and the inductor L2 of the first embodiment according to the invention.
Figure 10:
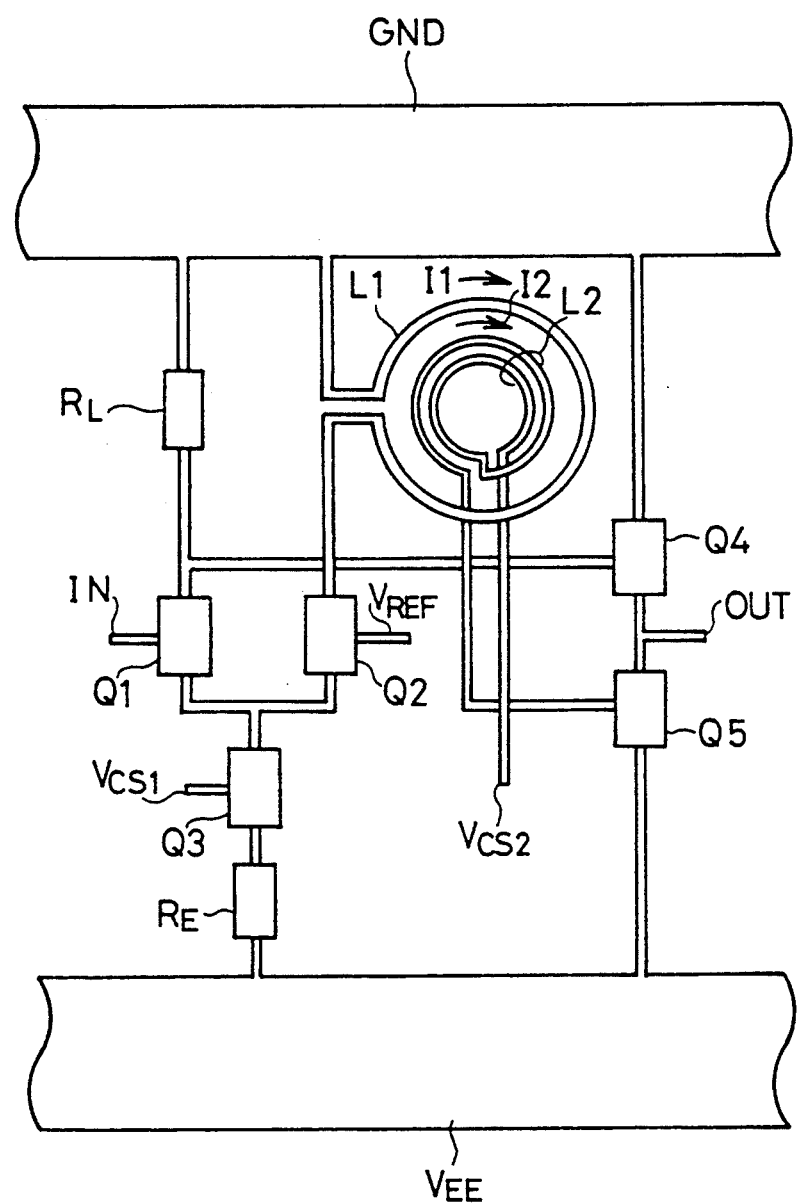
FIG. 10 is a pattern layout view showing the first embodiment of the invention.

Then, the self-inductance of each loop is given as follows:

$$L1 = \mu \cdot r1 \cdot \{ln(8 \cdot r1/reff) - 7/4\} \quad (8)$$

$$L2 = \mu \cdot r2 \cdot \{ln(8 \cdot r2/reff) - 7/4\}. \quad (9)$$

Where $\mu$ represents a magnetic permeability. In addition, the mutual inductance M between the loops is given as follows:

$$M = \mu \cdot \sqrt{r1 \cdot r2} \cdot A(p) \quad (10)$$

Where A(p) is a function of a ratio of r2 to r1, namely, $$r = r2/r1$$

in which $$A(p) = 2 \cdot \{(1 - p^*p/2) \cdot K(p) - E(p)\}/p$$

$$p = 2\frac{\sqrt{r}}{1+r}$$

Where K(p) and E(p) represent first and second kind complete elliptic integrals, respectively. Defining the magnetic permeability for vacuum, that is, $$\mu = 4\pi \cdot 10^{-7} H/m$$

and defining exemplary section dimensions (width w and thickness t) for the wiring at
w = πμm
t = 1 μm
then reff = 1 μm
is obtained from the Equation (7). Therefore, assuming
r1 = 150 μm
then
L1 = 1.0 nH
is obtained from the Equation (8). Also assuming
r2 = 84 μm
while composing the inductor L2 in 2 loops and ignoring the mutual inductance between said loops,
L2 = 1.0 nH is obtained from the Equation (9). At that time, from the Equation (10),
M = −0.39 nH
is obtained and, from the Equation (6),
K = 0.39
is obtained as a preferred characteristic. The layout view of the mutual inductor at that time is shown in FIG. 9. An exemplary layout of the inverter corresponding to that shown in FIG. 3, using said mutual inductor, is shown in FIG. 10. Where a magnetic material such as nickel is used, the permeability $\mu$ is larger. Therefore, the mutual inductor having a preferred inductance is realized in smaller radii r1 and r2, thereby enabling to reduce an area occupied on a chip.

Second Embodiment

Figure 11:
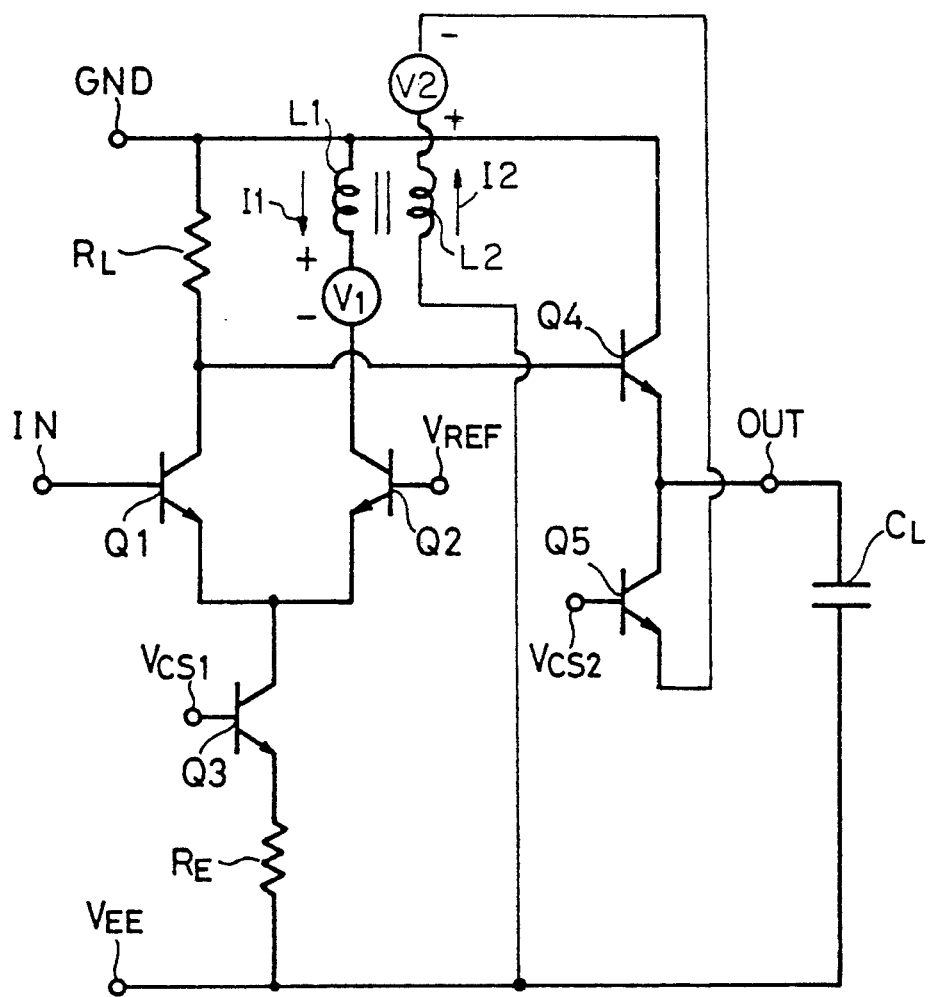
FIG. 11 is a circuit diagram of an ECL inverter circuit according to a second embodiment of the invention.

FIG. 11 depicts a second embodiment of the ECL inverter circuit according to the present invention. This second embodiment is different from the above explained first embodiment in that the inductor L2 is inserted between the emitter of the transistor Q5 and the constant voltage source $V_{EE}$.

Figure 12:
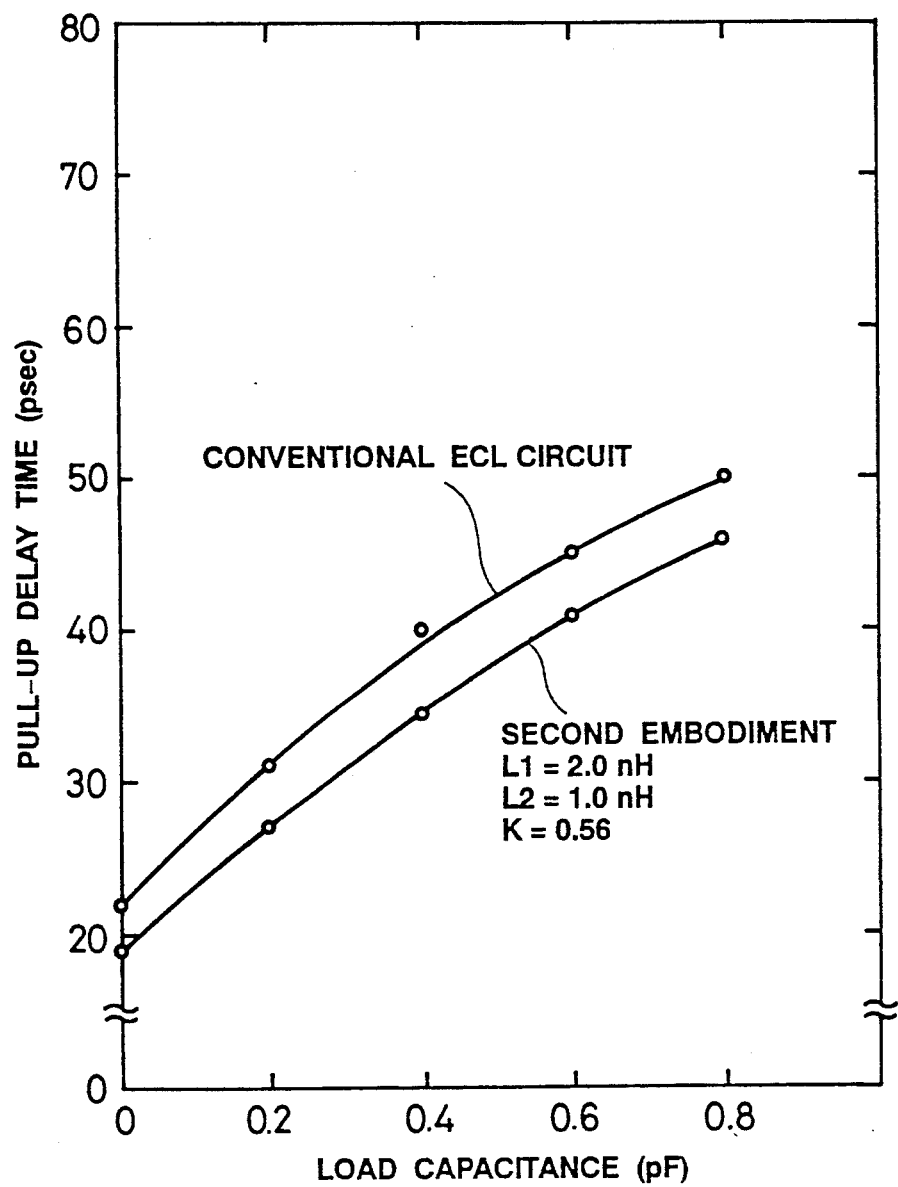
FIG. 12 is a graph illustrating the dependency of the pull-up delay time on the load capacitance of the second embodiment according to the invention.
Figure 13:
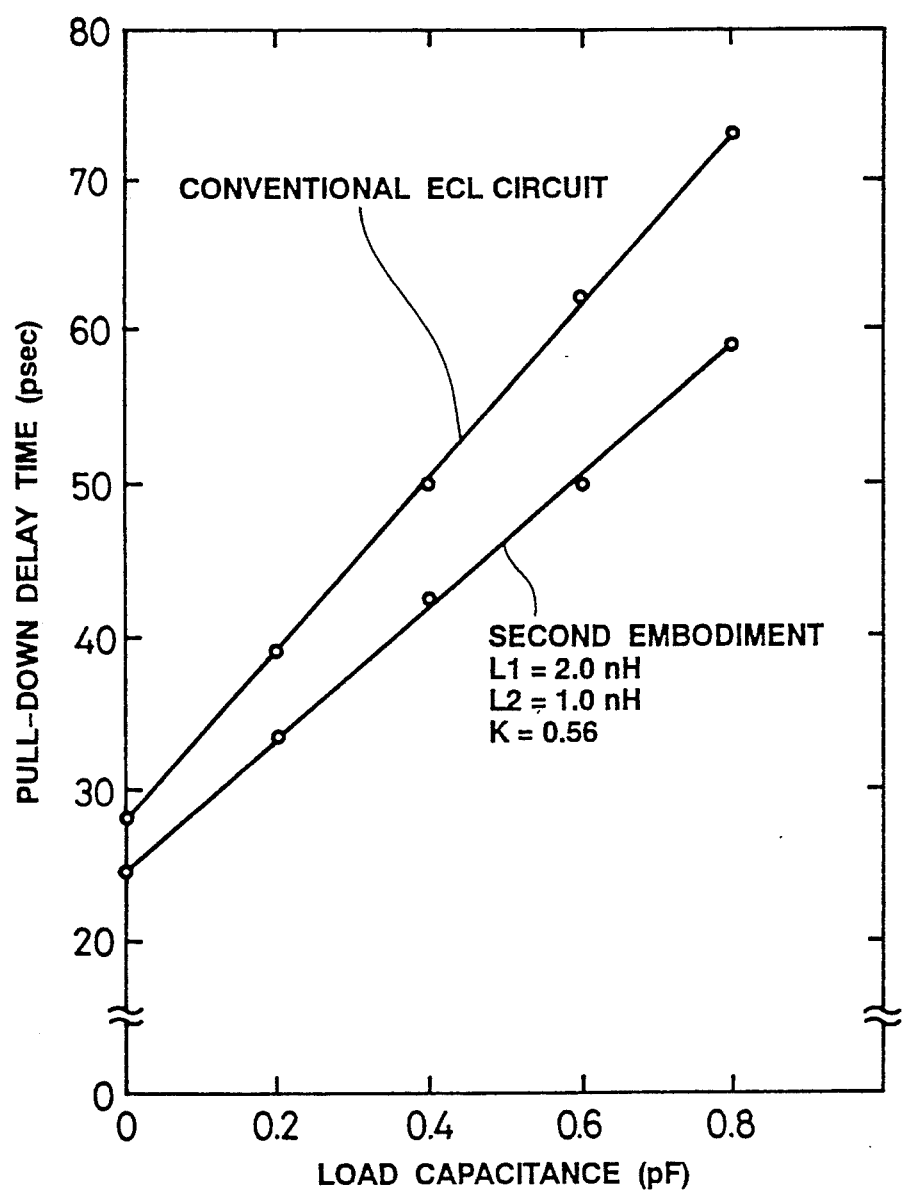
FIG. 13 is a graph illustrating the dependency of the pull-down delay time on the load capacitance of the second embodiment according to the invention.

A simulation result obtained by the second embodiment is described hereinafter.
Assuming that $$L1 = 2.0 \, nH \quad (11)$$

$$L2 = 1.0 \, nH \quad (12)$$

$$K = 0.56 \quad (13)$$

while maintaining the other parameters or conditions the same as those of the first embodiment, the dependencies of pull-up delay time and pull-down delay time on a load capacitance are as shown in FIGS. 12 and 13, respectively. With a load capacitance of 0.4 pF, the pull-up and pull-down delay time periods are improved by 5.5 psec (14%) and 7.5 psec (15%), respectively, from those of the conventional ECL circuit. With the second embodiment, a current flowing in the inductor L2 is larger (by hfe times, hfe being a current amplification factor of the transistor Q5) than that of the first embodiment. Therefore, a negative feedback by the self-inductance acts on the transistor Q5. Consequently, large load inductor L1 and larger coupling coefficient K are required to have the same effect as that achieved by the first embodiment.

Figure 14:
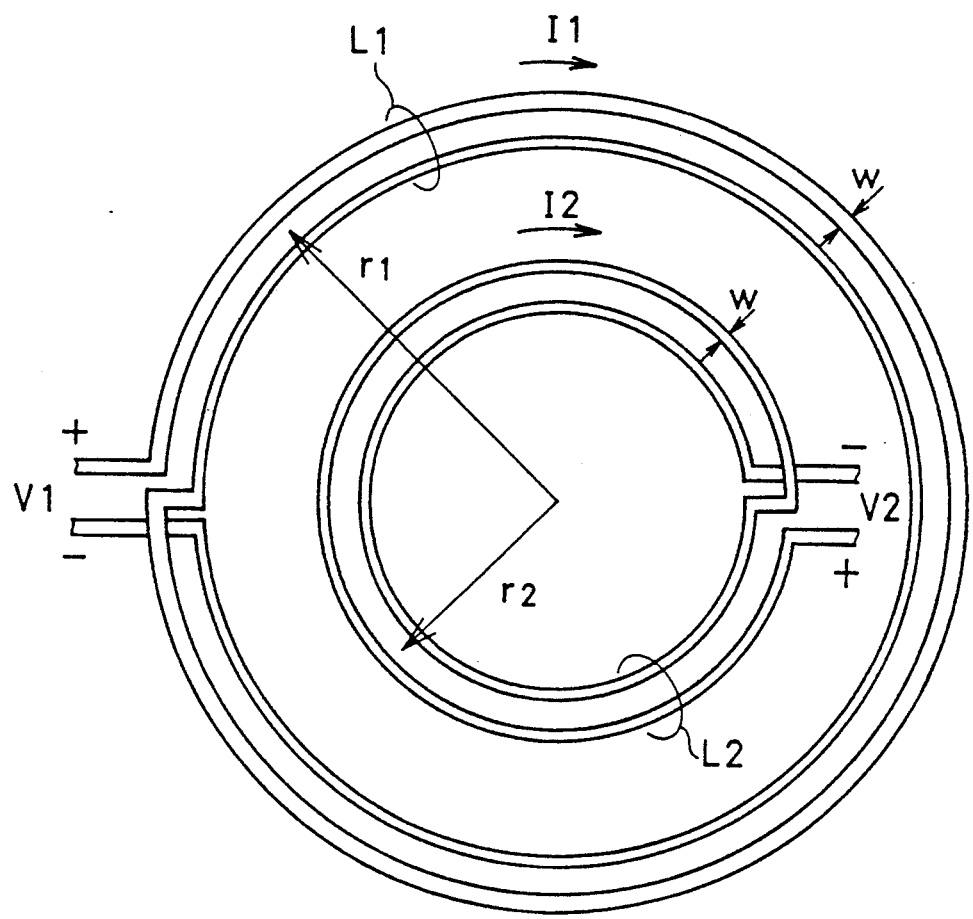
FIG. 14 is a schematic view showing an example of the load inductor L1 and the inductor L2 of the second embodiment according to the invention shown in FIG. 11.
Figure 15:
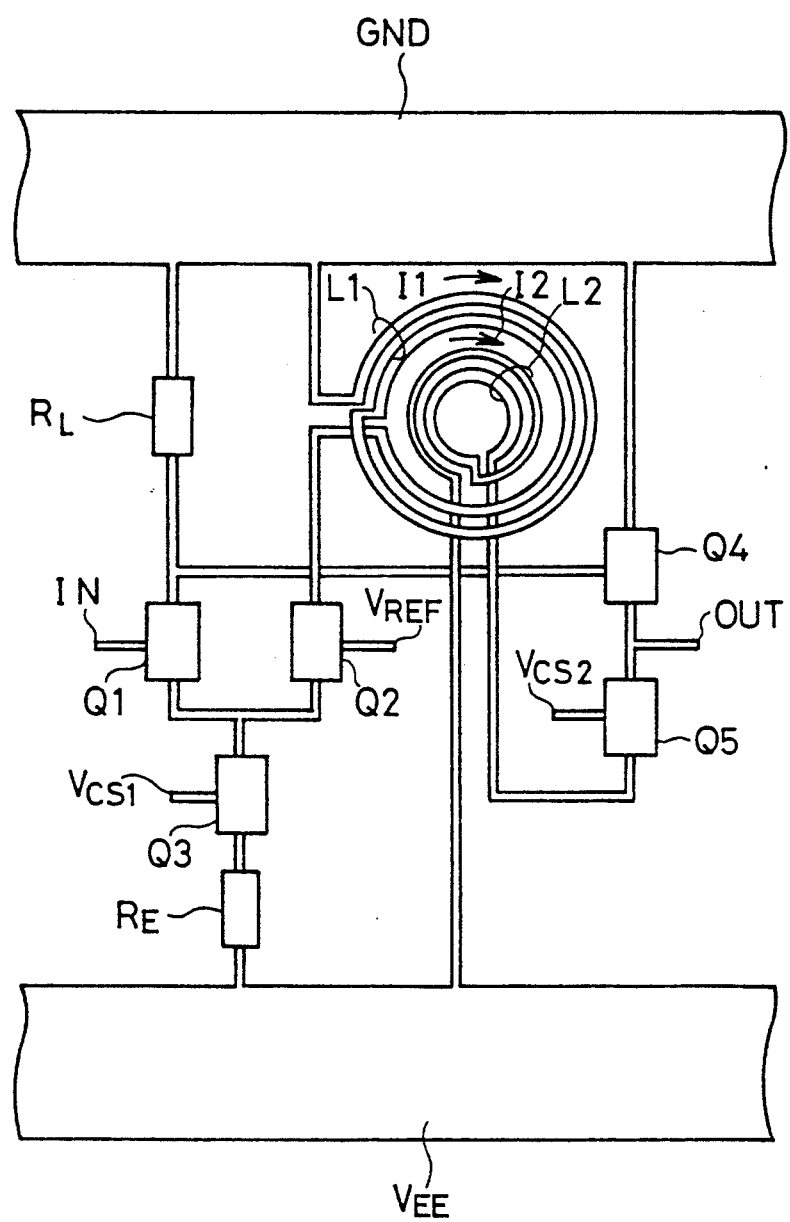
FIG. 15 is a pattern layout view showing an example of the second embodiment of the invention.

FIG. 14 illustrates a layout to realize the self-inductances of the above Equations (11) and (12) and the coupling coefficient of the Equation (13). As shown in FIG. 14, the inductor L1 is formed in a double loop by modifying the first embodiment (FIG. 9). If the mutual inductance is ignored, the self-inductance of the inductor L1 is thus doubled while also making M twice as much. Consequently, the coupling coefficient K becomes $\sqrt{2}$ times as much, whereby a preferred value is obtained. An example of the layout of an inverter corresponding to FIG. 11 having the above inductors is shown in FIG. 15.

Third Embodiment

Figure 16:
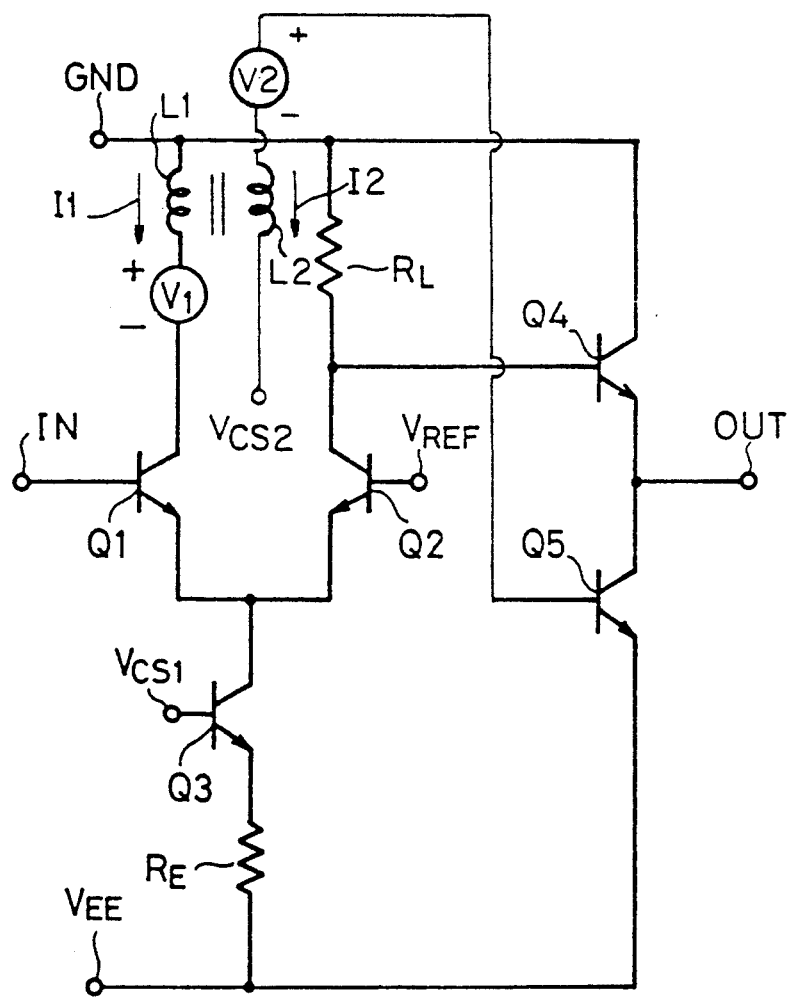
FIG. 16 is a circuit diagram of an ECL buffer circuit according to a third embodiment of the invention.

FIG. 16 shows an ECL circuit of a third embodiment according to the present invention. A non-inversion buffer circuit where, in the inverter circuit of the first embodiment shown in FIG. 3, the locations of the load resistor $R_L$ and the load inductor L1 are exchanged.

Fourth Embodiment

Figure 17:
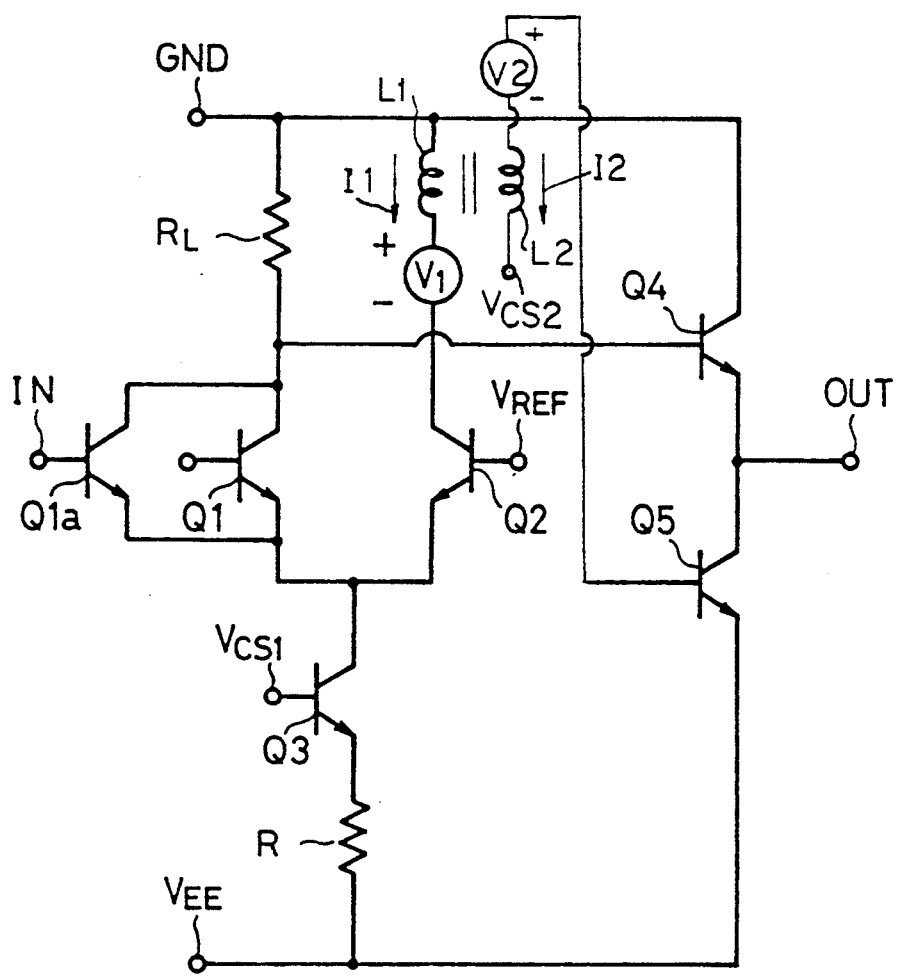
FIG. 17 is a circuit diagram of an ECL 2-input NOR circuit according to a fourth embodiment of the invention.

Finally, FIG. 17 shows an ECL circuit of a fourth embodiment according to the present invention. In a two-input NOR circuit, there is added an input transistor Q1a which is connected in parallel to the transistor Q1 in the inverter circuit of the first embodiment shown in FIG. 3.

As has been described hereinabove, with the ECL circuit according to the present invention, one of the load resistors of the differential transistors is replaced by an inductor which is AC-coupled with an inductor of the constant voltage source of the emitter follower by a mutual inductance effect. Thus, as compared to a conventional ECL circuit, both the pull-up and pull-down delay time periods can be reduced in a wide range from a light load to a heavy load. In addition, it is also obvious that, by reducing a bias current, the pull-up and pull-down delay times similar to those of the conventional ECL circuits can be realized while reducing a consumption of power.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An emitter-coupled logic circuit comprising:
a first and a second power supply terminal;
a differential pair of first and second transistors whose emitters are connected with each other, said first transistor having a base connected to an input terminal, and said second transistor having a base connected to a reference voltage source;
a load resistor connected between said first power supply terminal and a collector of one of said first and second transistors;
a load inductor connected between said first power supply terminal and a collector of the other one of said first and second transistors;
a first constant current source connected between said second power supply terminal and the common emitters of said first and second transistors, for supplying a constant current to said first and second transistors; and
an emitter follower output stage whose input node is connected to said load resistor and whose output node is connected to an output terminal and coupled to said second power supply terminal through a second constant current source including an inductor, said inductor being AC-coupled with said load inductor by a mutual induction effect.

2. An emitter-coupled logic circuit according to claim 1, in which said load resistor is connected to said first transistor and said load inductor is connected to said second transistor, thereby constituting an inverter circuit.

3. An emitter-coupled logic circuit according to claim 1, in which said load resistor is connected to said second transistor and said load inductor is connected to said first transistor, thereby constituting a buffer circuit.

4. An emitter-coupled logic circuit according to claim 2, further comprising an input transistor which is connected in parallel to said first transistor, thereby constituting a two-input NOR circuit.

5. An emitter-coupled logic circuit according to claim 1, in which said second constant current source includes a current source transistor having a collector connected to the output node of said emitter follower output stage, a base connected to a constant voltage source through said inductor, and an emitter connected directly to said second power supply terminal.

6. An emitter-coupled logic circuit comprising:
a first and a second power supply terminal;
a differential pair of first and second transistors whose emitters are connected with each other, said first transistor having a base connected to an input terminal, and said second transistor having a base connected to a reference voltage source;
a load resistor connected between said first power supply terminal and a collector of one of said first and second transistors;
a load inductor connected between said first power supply terminal and a collector of the other one of said first and second transistors;
a first constant current source connected between said second power supply terminal and the common emitters of said first and second transistors, for supplying a constant current to said first and second transistors; and
an emitter follower output stage whose input node is connected to said load resistor and whose output node is connected to an output terminal and coupled to said second power supply terminal through a second constant current source including an inductor, said inductor being AC-coupled with said load inductor by a mutual induction effect wherein said second constant current source further includes a current source transistor having a collector connected to the output node of said emitter follower output stage, a base connected to a constant voltage source, and an emitter connected to said second power supply terminal through said inductor.

7. An emitter-coupled logic circuit according to claim 6, in which said load resistor is connected to said first transistor and said load inductor is connected to said second transistor, thereby constituting an inverter circuit.

* * * * *